United States Patent
Lim et al.

(10) Patent No.: US 7,432,560 B2
(45) Date of Patent: Oct. 7, 2008

(54) BODY-TIED-TO-SOURCE MOSFETS WITH ASYMMETRICAL SOURCE AND DRAIN REGIONS AND METHODS OF FABRICATING THE SAME

(75) Inventors: Hoon Lim, Seoul (KR); Soon-Moon Jung, Gyeonggi-do (KR); Won-Seok Cho, Gyeonggi-do (KR); Jae-Hun Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 32 days.

(21) Appl. No.: 11/179,236

(22) Filed: Jul. 12, 2005

(65) Prior Publication Data

US 2006/0049467 A1    Mar. 9, 2006

(30) Foreign Application Priority Data

Sep. 9, 2004    (KR) ............... 10-2004-0072355

(51) Int. Cl.
   *H01L 27/01*    (2006.01)
(52) U.S. Cl. .................... 257/382; 257/383
(58) Field of Classification Search ............ 257/382, 257/383; 438/149, 479, 517, 300
   See application file for complete search history.

(56) References Cited

U.S. PATENT DOCUMENTS

| | | | |
|---|---|---|---|
| 5,869,874 A * | 2/1999 | Manning | 257/382 |
| 5,929,490 A * | 7/1999 | Onishi | 257/347 |
| 5,937,299 A * | 8/1999 | Michael et al. | 438/299 |
| 5,965,917 A * | 10/1999 | Maszara et al. | 257/347 |
| 6,344,675 B1 * | 2/2002 | Imai | 257/347 |
| 6,525,378 B1 * | 2/2003 | Riccobene | 257/347 |
| 6,914,303 B2 * | 7/2005 | Doris et al. | 257/350 |

FOREIGN PATENT DOCUMENTS

| | | |
|---|---|---|
| JP | 05-075119 | 3/1993 |
| JP | 10-294465 | 11/1998 |
| KR | 2001-0107571 | 7/2001 |

OTHER PUBLICATIONS

Quirk, Michael, and Serda, Julian; Semiconductor Manufacturing Technology; 2001 New Jersey, Prentice-Hall Inc., p. 505.*

* cited by examiner

*Primary Examiner*—Richard T. Elms
*Assistant Examiner*—Allison P Bernstein
(74) *Attorney, Agent, or Firm*—Myers Bigel Sibley & Sajovec, P.A.

(57) ABSTRACT

A metal oxide semiconductor field effect transistor (MOSFET) includes a body pattern of a first conductivity type disposed on an insulating layer. A gate electrode is disposed on the body pattern. A drain region of a second conductivity type is disposed on the insulating layer and having a sidewall in contact with a first sidewall of the body pattern. An impurity-doped region of the first conductivity type is disposed on the insulating layer and having a sidewall in contact with a second sidewall of the body pattern. The MOSFET further includes a source region of the second conductivity type disposed on the impurity-doped region and having a sidewall in contact with the second sidewall of the body pattern, and a contact plug extending through the source region to contact the impurity-doped region.

11 Claims, 5 Drawing Sheets

BODY-TIED-TO-SOURCE MOSFETS WITH ASYMMETRICAL SOURCE AND DRAIN REGIONS AND METHODS OF FABRICATING THE SAME

CROSS-REFERENCE TO RELATED APPLICATION

This application claims the benefit of Korean Patent Application No. 2004-72355, filed Sep. 9, 2004, the contents of which are hereby incorporated herein by reference in their entirety.

BACKGROUND OF THE INVENTION

The present invention relates to metal oxide semiconductor field effect transistors (MOSFETs) and, more particularly, to body-tied-to-source MOSFETs and methods of fabricating the same.

As electronic appliances using semiconductor devices decrease in size and weight, it is desirable that the semiconductor devices have higher density per unit area, lower threshold voltage Vt, faster operating speed, and lower power consumption. Semiconductor devices widely employ transistors, such as metal oxide semiconductor (MOS) transistors, as switching devices. In response to the desire for high density, methods of stacking a plurality of transistors on a limited area of a semiconductor substrate are now under investigation. A typical method of stacking the transistors includes forming a lower transistor on the semiconductor substrate, forming an insulating layer covering the lower transistor, and forming a thin film transistor (TFT) on the insulating layer. However, stacking transistors can present several difficulties.

A technique for forming a transistor on a silicon-on-insulator (SOI) can provide advantages of low junction capacitance and good isolation characteristics, so it is widely applied in forming semiconductor devices with high-speed operation and low power consumption. In addition, an SOI MOS transistor can provide a low soft error rate and good latch-up characteristics.

Typical TFT and SOI MOS transistors have an insulating layer disposed on a semiconductor substrate, and a semiconductor layer, which is referred to as a body, disposed on the insulating layer. FIG. 1 is a cross-sectional view schematically illustrating a conventional SOI MOS transistor. The SOI MOS transistor includes an insulating layer 2 disposed on a semiconductor substrate 1. A body 3, a source 4, and a drain 5 are disposed on the insulating layer 2. A gate electrode 7 is disposed on the body 3, and a gate insulating layer 6 is interposed between the body 3 and the gate electrode 7.

The body 3 is in a floating state, that is, the body 3 of the SOI MOS transistor is isolated from the semiconductor substrate 1 due to the insulating layer 2, so that a voltage of the body 3 may change in response to a voltage applied to the source 4, the drain 5 and the gate electrode 7. Voltage variation of the body 3, referred to as a floating body effect, can impede proper operation of the SOI MOS transistor. Associated harmful effects include a kink effect and a parasitic bipolar effect.

When the body 3 is partially depleted and a high voltage is applied to the drain 5, an electric field generated in the MOS transistor can cause impact ionization near the drain 5. As a result, when the MOS transistor is an NMOS transistor, holes generated by the impact ionization may be injected into the body 3, so that the body 3 is charged with positive electric charges. These positive electric charges accumulated in the body 3 can increase the potential of the body 3, which can cause a threshold voltage of the MOS transistor to be decreased. The decrease of the threshold voltage allows the drain current to increase, so that a kink phenomenon may occur in output characteristics of the MOS transistor.

The charged body 3 may also turn on a lateral bipolar transistor structure, i.e., an n-p-n structure including the source 4, the body 3, and the drain 5. When the body 3 of the MOS transistor becomes biased with a positive voltage, a forward bias is applied to a junction between the source 4 and the body 3 corresponding to a junction between an emitter and a base of the lateral n-p-n structure, so that electrons may be injected from the source 4 to the body 3. The electrons injected into the body 3 reach a drain depletion region to be added to a drain current. As a result, the drain current may be mainly controlled by a parasitic bipolar transistor, rather than a channel current flowing under the control of the gate electrode 7. Such an effect is referred to as a parasitic bipolar effect. The parasitic bipolar operation of the MOS transistor can cause undesirable leakage current.

Some techniques have been proposed in order to reduce harmful effects associated with the floating body effect. For example, some research has been conducted on methods of directly applying an external voltage to the body 3. However, these methods may require an additional interconnection. The additional interconnection can limit the degree of integration of a semiconductor device.

Research has also been conducted on methods of connecting the body 3 to the gate electrode 7. However, these methods may not avoid the problem of dynamic leakage current between the source and the drain when the gate voltage is high and the source and drain voltages are low. In addition, potentials between the body 3, the source 4, and the drain 5 typically change according to on and off states of the MOS transistor.

Methods of connecting the body 3 to the source 4 have also been proposed. These methods of connecting the body 3 to the source 4 may be effectively used when sources are fixed to Vcc or Vss, as in a driver transistor and a load transistor of a static random access memory (SRAM) cell.

Methods of connecting a body to a source in an SOI MOS transistor are disclosed in U.S. Pat. No. 6,111,293 entitled "Silicon-on-insulator MOS structure" to Liao. In this patent, a SOI MOS structure includes a double implanted source region.

A body region, a source region, a drain region, and an insulated gate electrode are formed on an SOI semiconductor substrate. A nitride layer is formed on the gate electrode. First conductivity type impurity ions are implanted into the source region and the drain region using the nitride layer and the gate electrode as ion implantation masks. An ion implantation mask is then formed to cover the drain region and expose the source region. Second conductivity type impurity ions are implanted into the source region using the ion implantation mask. As a result, the source region is divided into an upper impurity region and a lower impurity region. A metal contact plug is then formed to penetrate the upper impurity region and contact with the lower impurity region. Consequently, a structure is formed such that the upper impurity region and the lower impurity region are electrically connected to the metal contact plug. In addition, the metal contact plug is electrically connected to the body region through the lower impurity region. However, when impurity ions are implanted into the source region over two times, an interface between the upper impurity region and the lower impurity region may not be explicit and a junction characteristic of the upper impurity region may be degraded.

In light of the foregoing, there is an ongoing need for techniques for enhancing the characteristics of a MOS transistor having a body region disposed on an insulating layer.

SUMMARY OF THE INVENTION

In some embodiments of the present invention, a metal oxide semiconductor field effect transistor (MOSFET) includes a body pattern of a first conductivity type disposed on an insulating layer. A gate electrode is disposed on the body pattern. A drain region of a second conductivity type is disposed on the insulating layer and has a sidewall in contact with a first sidewall of the body pattern. An impurity-doped region of the first conductivity type is disposed on the insulating layer and has a sidewall in contact with a second sidewall of the body pattern. The MOSFET further includes a source region of the second conductivity type disposed on the impurity-doped region and having a sidewall in contact with the second sidewall of the body pattern, and a contact plug extending through the source region to contact the impurity-doped region.

According to further embodiments, a gate insulating layer is interposed between the gate electrode and the body pattern, and the upper surfaces of the source and drain regions may be higher than a top surface of the gate insulating layer. An insulating spacer may be disposed on a sidewall of the gate electrode, and a lightly doped source region may be disposed adjacent the source region and underlying the insulating spacer. The contact plug may extend through both the source region and the impurity-doped region, and may further extend through the first insulating layer.

In further embodiments of the present invention, methods of fabricating MOSFETs are provided. A first semiconductor region of a first conductivity type is formed on a substrate. A gate electrode is formed on the first semiconductor region. The first semiconductor region is doped with Impurity ions of the first conductivity type to form an impurity-doped region of the first conductivity type on a first side of the gate electrode. A portion of the impurity-doped region of the first conductivity type and a portion of the first semiconductor region on a second side of the gate electrode are removed to form respective trenches on the first and second sides of the insulated gate electrode. Second and third semiconductor regions are formed in the trenches, and the second and third semiconductor regions are doped with impurity ions of a second conductivity type to form a source region on the first side of the gate electrode, a drain region on the second side of the gate electrode and a body pattern underlying the gate electrode and having a first sidewall contacting the source region and the impurity-doped region of the first conductivity type and a second sidewall contacting the drain region. A contact plug is formed that extends through the source region to contact the impurity-doped region of the first conductivity type.

In additional embodiments, doping of the first semiconductor region to form a first impurity-doped region of the first conductivity type on a first side of the gate electrode is preceded by forming a photoresist pattern having an opening exposing a portion of the first semiconductor region on the first side of the gate electrode, and doping of the first semiconductor region to form a first impurity-doped region of the first conductivity type on a first side of the gate electrode includes implanting ions into the first semiconductor region using the photoresist pattern as an ion implantation mask.

Forming a photoresist pattern may be preceded by forming a hard mask pattern on the gate electrode, implanting ions of the second conductivity type into the first semiconductor region using the hard mask pattern as an ion implantation mask to form respective first and second impurity-doped regions of the second conductivity type in the first semiconductor region on the first and second sides of the gate electrode, and forming respective sidewall spacers on sidewalls of the gate electrode and overlying the first and second impurity-doped regions of the second conductivity type. Forming a photoresist pattern may include forming a photoresist pattern on the sidewall spacers and having an opening that exposes the first impurity-doped region of the second conductivity type, and implanting ions into the first semiconductor region using the photoresist pattern as an ion implantation mask may include implanting ions into the exposed portion of the first impurity-doped region of the second conductivity type to form the impurity-doped region of the first conductivity type and leave an impurity-doped region of the second conductivity type underlying the sidewall spacer on the first side of the gate electrode.

DETAILED DESCRIPTION OF EXEMPLARY EMBODIMENTS

Figure 1:
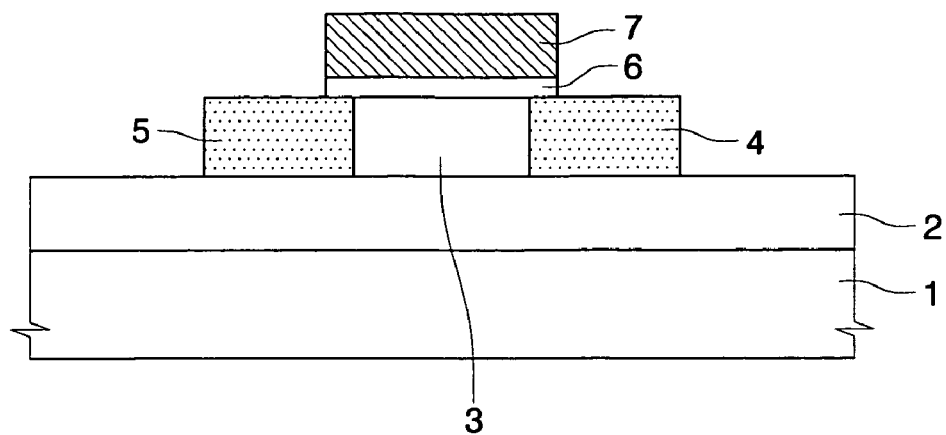
FIG. 1 is a cross-sectional view schematically illustrating a conventional SOI MOS transistor.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
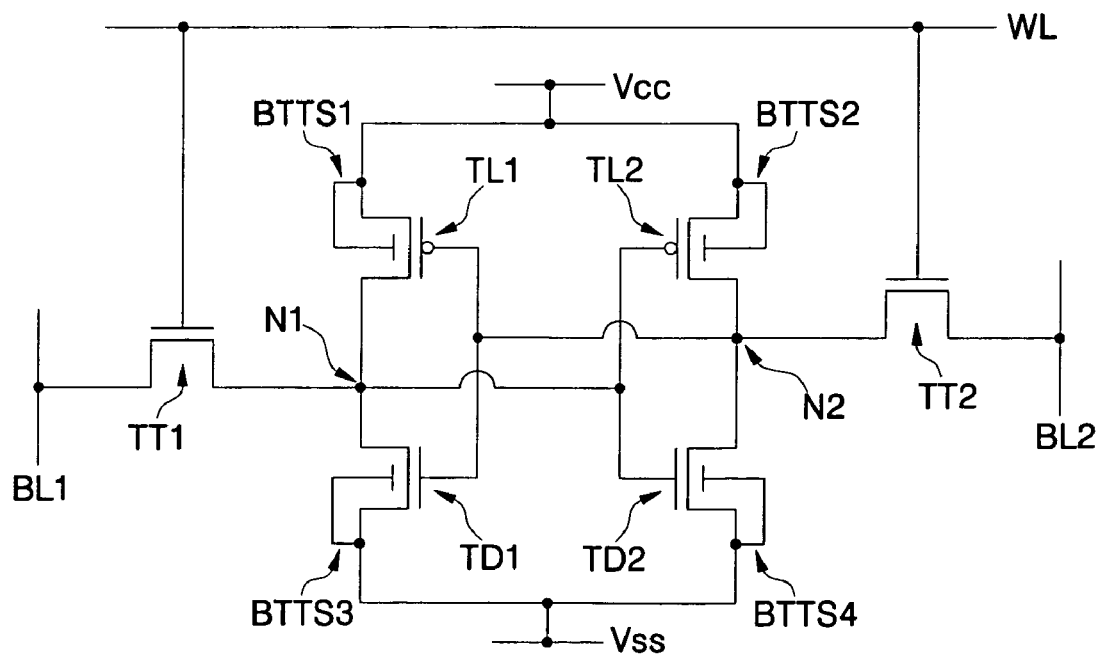
FIG. 2 is an equivalent circuit schematic of a complementary MOS (CMOS) SRAM cell.

FIG. 2 is an equivalent circuit view of a CMOS SRAM cell. The CMOS SRAM cell includes a pair of driver transistors TD1 and TD2, a pair of transfer transistors TT1 and TT2, and a pair of load transistors TL1 and TL2. The driver transistors TD1 and TD2 and the transfer transistors TT1 and TT2 are NMOS transistors, and the load transistors TL1 and TL2 are PMOS transistors.

The first driver transistor TD1 and the first transfer transistor TT1 are connected in series. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are serially connected. A source region of the second driver transistor TD2 is electrically connected to the ground line Vss, and a drain region of the second transfer transistor TT2 is electrically connected to a second bit line BL2.

A source region of the first load transistor TL1 is electrically connected to a power supply line Vcc, and a drain region of the first load transistor TL1 is electrically connected to a drain region of the first driver transistor TD1. Similarly, a source region of the second load transistor TL2 is electrically connected to the power supply line Vcc, and a drain region of the second load transistor TL2 is electrically connected to a drain region of the second driver transistor TD2.

The drain region of the first load transistor TL1, the drain region of the first driver transistor TD1, and the source region of the first transfer transistor TT1 correspond to a first node N1. In addition, the drain region of the second load transistor TL2, the drain region of the second driver transistor TD2, and the source region of the second transfer transistor TT2 correspond to a second node N2. A gate electrode of the first driver transistor TD1 and a gate electrode of the first load transistor TL1 are electrically connected to the second node N2, and a gate electrode of the second driver transistor TD2 and a gate electrode of the second load transistor TL2 are electrically connected to the first node N1. In addition, gate electrodes of the first and second transfer transistors TT1 and TT2 are electrically connected to a word line WL.

The above-described CMOS SRAM cell may be formed in various ways. For example, all of the above-described transistors may be formed on a bulk silicon semiconductor substrate. The transfer transistors TT1 and TT2 and the driver transistors TD1 and TD2 may be formed on a bulk silicon semiconductor substrate and the load transistors TL1 and TL2 may be formed on an insulating layer as thin film transistors (TFTs). All of the above-described transistors may be formed on an SOI semiconductor substrate. The transfer transistors TT1 and TT2 and the driver transistors TD1 and TD2 may be formed on an SOI semiconductor substrate and the load transistors TL1 and TL2 may be formed as TFTs. In these techniques, the TFTs and the SOI transistors include an insulating layer disposed on the substrate, and a semiconductor layer, referred to as a body, on the insulating layer. As described above, techniques that can reduce harmful effects associated with a floating body effect are desired.

In accordance with some embodiments of the present invention, harmful effects caused by a floating body effect may be reduced by employing a structure in which the body and the source are electrically connected to each other. MOS transistors used for a semiconductor device conventionally have symmetrical source/drain regions. A first region may serve as a drain and a second region as a source in a first operating condition, and the second region may serve as a source and the first region serve as a drain in a second operating condition. As such, when source and drain functions are interchanged based on the operating conditions of the transistor, it may be difficult to employ a structure in which the body and the source are electrically connected to each other.

Referring to FIG. 2, when the source regions of the load transistors TL1 and TL2 and the driver transistors TD1 and TD2 which are used for the CMOS SRAM cell are fixed and electrically connected to any one of a power supply line Vcc and a ground line Vss, the structure in which the body and the source are electrically connected to each other may be effectively used as the solution for reducing harmful effects associated with the floating body effect. In particular, the body region and the source region of the first load transistor TL1 may be electrically connected to form a first body-to-tied-source (BTTS1), the body region and the source region of the second load transistor TL2 may be electrically connected to form a second body-to-tied-source (BTTS2), the body region and the source region of the first driver transistor TD1 may be electrically connected to form a third body-to-tied-source (BTTS3), and the body region and the source region of the second driver transistor TD2 may be electrically connected to form a fourth body-to-tied-source (BTTS4). The BTTS1 and the BTTS2 may be electrically connected to the power supply line Vcc, and the BTTS3 and the BTTS4 may be electrically connected to the ground line Vss.

Figure 8:
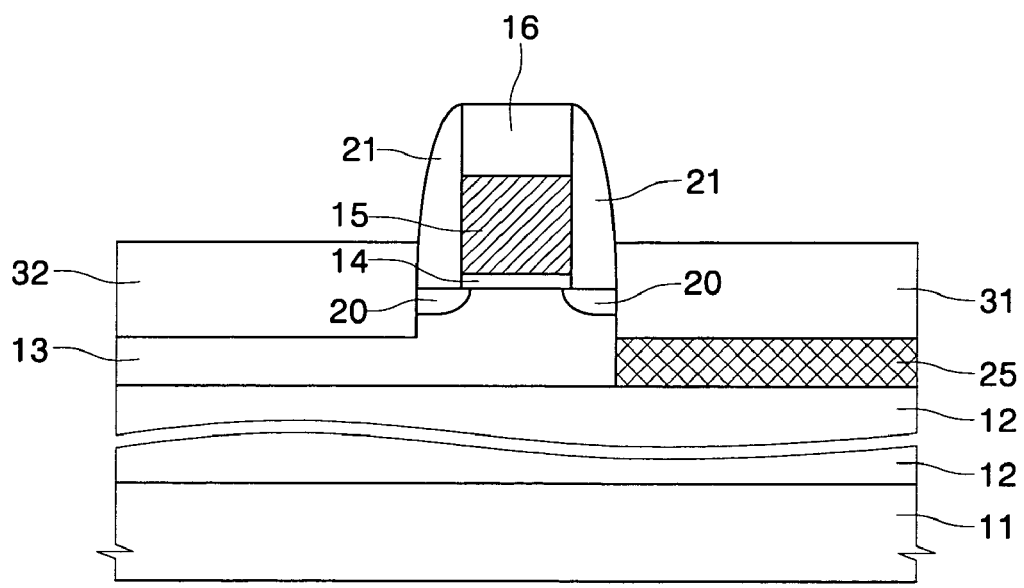
Figure 9:
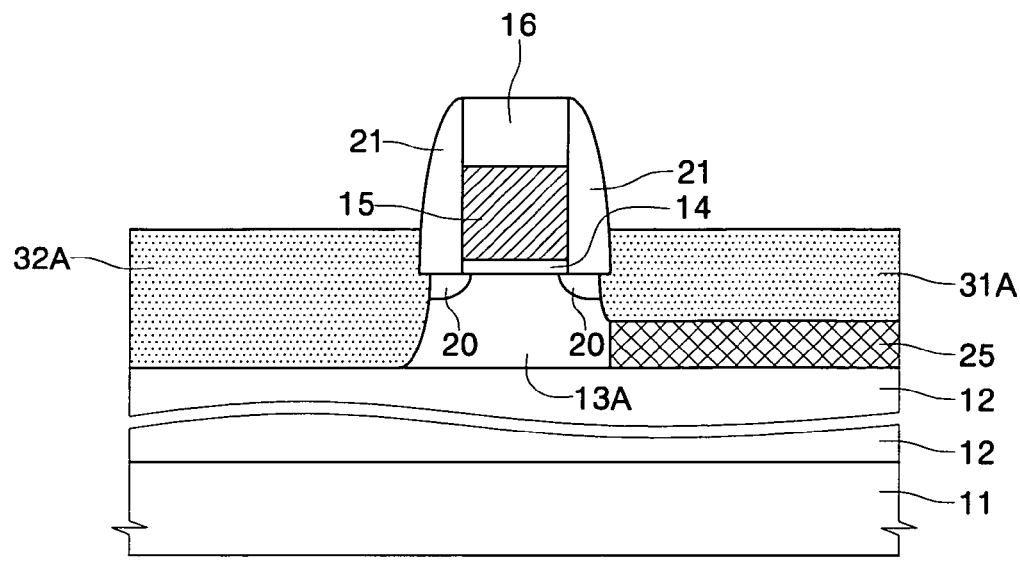
Figure 10:
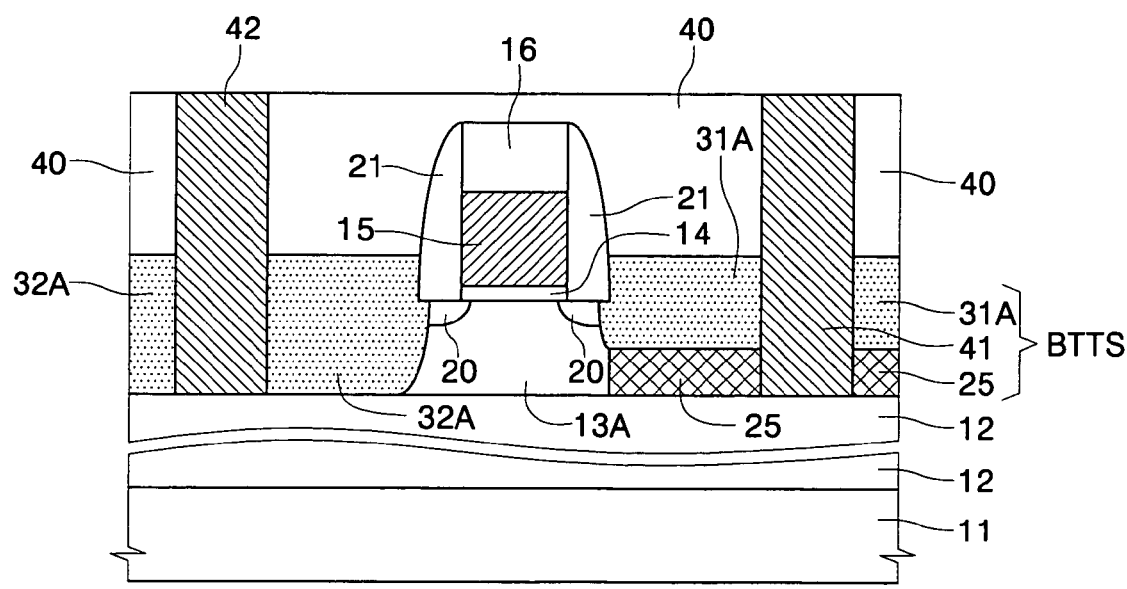

FIGS. 3 to 10 are cross-sectional views illustrating a MOSFET with a BTTS structure and methods of fabrication therefor in accordance with some embodiments of the present invention. Referring to FIG. 10, a lower insulating layer 12 is disposed on a substrate 11. The substrate 11 may be a semiconductor substrate, such as a silicon wafer. Circuits, such as lower transistors, may be interposed between the substrate 11 and the lower insulating layer 12, but are not shown for simplicity of description. The substrate 11 may be an SOI substrate. When the substrate 11 is the SOI substrate, the lower insulating layer 12 is referred to as a buried oxide layer.

At least one semiconductor body pattern 13A of a first conductivity type is disposed on the lower insulating layer 12. The body pattern 13A is electrically insulated from the lower circuits or the substrate 11 by the lower insulating layer 12. The first conductivity type may be a P-type or an N-type. The body pattern 13A may be formed, for example, from a single crystalline silicon layer, a polycrystalline silicon layer, a germanium layer, or a compound semiconductor layer.

An insulated gate electrode 15 is disposed on the body pattern 13A. A gate insulating layer 14 is interposed between the body pattern 13A and the insulated gate electrode 15. A hard mask pattern 16 is disposed on the insulated gate electrode 15, and an insulating spacer 21 is disposed on a sidewall of the insulated gate electrode 15. Lightly doped impurity regions 20 are disposed in the body pattern 13A below the insulating spacer 21. The lightly doped impurity regions 20 have a second conductivity type, opposite to the first conductivity type, e.g., the second conductivity type is N-type when the first conductivity type is P-type, and is P-type when the first conductivity type is N-type.

A drain region 32A of a second conductivity type with a sidewall in contact with the body pattern 13A is positioned on the lower insulating layer 12. The drain region 32A is electrically connected to one of the lightly doped impurity regions 20. An upper surface of the elevated drain region 32A is positioned higher than an upper surface of the gate insulating layer 14. The drain region 32A is insulated from the gate electrode 15 by the insulating spacer 21.

A highly doped impurity region 25 of a first conductivity type having a sidewall in contact with the body pattern 13A is positioned on the lower insulating layer 12, at an opposite side of the gate electrode 15 from the drain region 32A. The highly doped impurity region has a thickness less than that of the body pattern 13A. The highly doped impurity region 25 has the same first conductivity type as the body pattern 13A and is electrically connected to the body pattern 13A. A source region 31A of a second conductivity type having a sidewall in contact with the body pattern 13A is disposed on the highly doped impurity region 25. The source region 31A is electrically connected to the other of the lightly doped impurity regions 20. A top surface of the source region 31A is higher than the gate insulating layer 14. The elevated source region 31A is insulated from the gate electrode 15 by the insulating spacer 21.

The substrate 11 having the insulated gate electrode 15, the source region 31A, and the drain region 32A thereon is covered by an upper inter-insulating layer 40. A drain contact plug 42 penetrates the upper inter-insulating layer 40 to contact the elevated drain region 32A. The drain contact plug 42 may further penetrate the elevated drain region 32A to contact the lower insulating layer 12. In some embodiments, the drain contact plug 42 may also penetrate the lower insulating layer 12 to contact a lower circuit.

A source contact plug 41 penetrates the upper inter-insulating layer 40 and the source region 31A to contact the highly doped impurity region 25. The source contact plug 41 may further penetrate the highly doped impurity region 25 to contact the lower insulating layer 12. In further embodiments, the source contact plug 41 may also penetrate the lower insulating layer 12 to contact a lower circuit and/or the substrate 11. The source region 31A, the highly doped impurity region 25, and the body pattern 13A are electrically connected to each other through the source contact plug 41, providing a BTTS structure, which can prevent the body pattern 13A from electrically floating.

Figure 3:
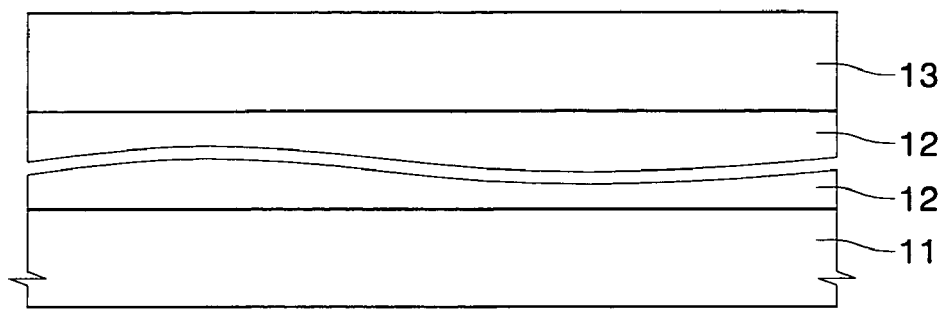
FIGS. 3 to 10 are cross-sectional views illustrating fabrication products and operations for fabricating a MOSFET in accordance with some embodiments of the present invention.

Hereinafter, methods of fabricating a MOSFET with a BTTS structure according to some embodiments of the present invention will be described with reference to FIGS. 3 to 10. Referring to FIG. 3, a lower insulating layer 12 and a semiconductor body region 13 are sequentially formed on a substrate 11. The substrate 11 may be, for example, a semiconductor substrate, such as a silicon wafer. The lower insulating layer 12 may be an insulating layer, such as a silicon oxide layer. Circuits, such as lower transistors, may be interposed between the substrate 11 and the lower insulating layer 12, but are not shown for simplicity of description. The substrate 11 may be an SOI substrate. When the substrate 11 is an SOI substrate, the lower insulating layer 12 is referred to as a buried oxide layer and serves to electrically insulate the body region 13 from the substrate 11.

The body region 13 is formed from a semiconductor layer of a first conductivity type. The first conductivity type may be an N-type or a P-type. When the body region 13 is an N-type, a PMOS transistor may be formed. Alternatively, when the body region 13 is a P-type, an NMOS transistor may be formed. The semiconductor layer may be a single crystalline silicon layer, a polycrystalline silicon layer, a germanium layer, or a compound semiconductor layer. An isolation region (not shown) is formed within the semiconductor layer to define the body region 13. The isolation region may be formed from an insulating layer, such as a high-density plasma (HDP) oxide layer.

Figure 4:
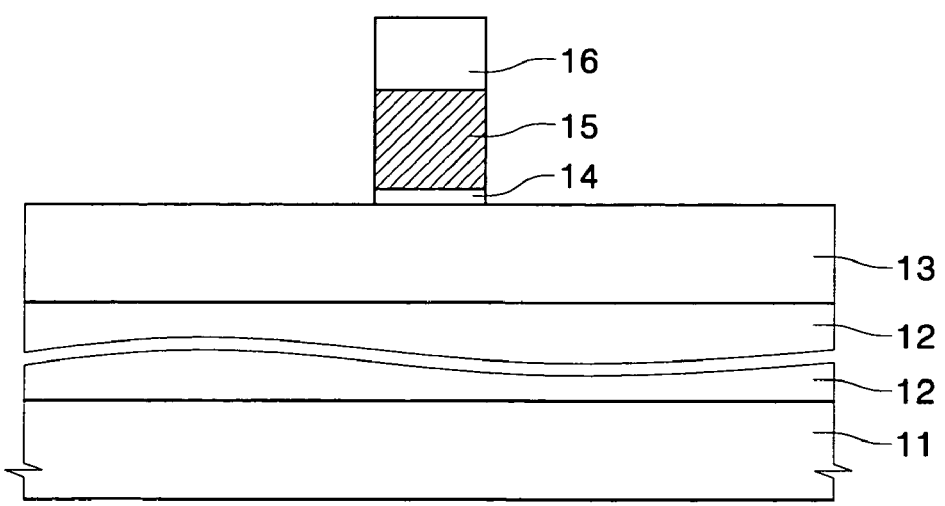

Referring to FIG. 4, a gate insulating layer pattern 14, an insulated gate electrode 15, and a hard mask pattern 16 are sequentially formed on the body region 13. In detail, a gate insulating layer, a gate conductive layer, and a hard mask layer are formed on the substrate 11, covering the body region 13. The gate insulating layer may be, for example, a silicon oxide layer. The gate conductive layer may be, for example, a doped polysilicon layer. The hard mask layer may be a material layer which has an etch selectivity to the body region 13. For example, the hard mask layer may be a nitride layer, such as a silicon nitride layer formed using a chemical vapor deposition (CVD) method. The hard mask layer, the gate conductive layer, and the gate insulating layer are patterned to form the hard mask pattern 16, the insulated gate electrode 15, and the gate insulating layer pattern 14. The hard mask pattern 16 may be omitted.

Figure 5:
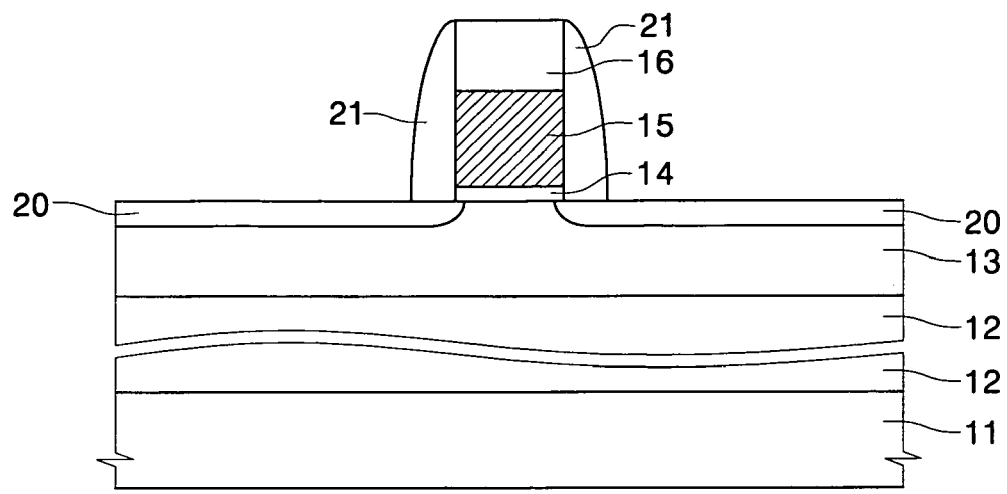

Referring to FIG. 5, impurity ions of a second conductivity type may be selectively implanted into the body region 13 using the hard mask pattern 16 as an ion implantation mask to form lightly doped impurity regions 20 at respective sides of the insulated gate electrode 15. The second conductivity type is opposite to the first conductivity type. For example, when the body region 13 is P-type, the impurity ions of the second conductivity type implanted into the lightly doped impurity regions 20 are N-type. Alternatively, when the body region 13 is N-type, the impurity ions of the second conductivity type implanted into the lightly doped impurity regions 20 are P-type.

A conventional technique may be used to form insulating spacers 21 on the sidewall of the gate electrode 15. The insulating spacers 21 may be formed from a material layer having an etch selectivity to the body region 13. For example, the insulating spacers 21 may be formed of at least one insulating layer selected from a silicon nitride layer, a silicon oxynitride layer, and a silicon oxide layer.

Figure 6:
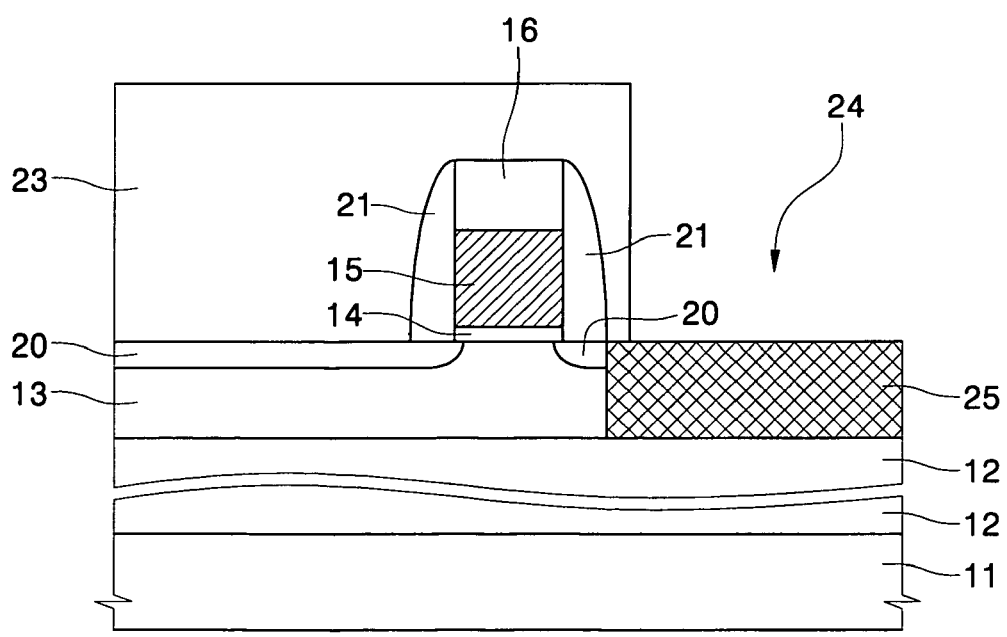

Referring to FIG. 6, a photoresist pattern 23 having a source opening 24 is formed on the substrate 11 having the insulating spacers 21 thereon. In detail, a photoresist layer is formed on the substrate 11 having the insulating spacers 21. The photoresist layer may be patterned using a conventional photolithography process to form the photoresist pattern 23. The photoresist pattern 23 has a source opening 24, which partially exposes a top surface of the body region 13. An anti-reflective coating layer may be further formed on the substrate 11 having the insulating spacers 21 prior to the formation of the photoresist layer. The anti-reflective coating layer may suppress diffused reflection during the photolithography process to allow a fine pattern to be formed.

Highly doped impurity ions of a first conductivity type are selectively implanted into the body region 13 using the photoresist pattern 23 as an ion implantation mask to form a highly doped impurity region 25 at one side of the gate electrode 15. The highly doped impurity ions of the first conductivity type implanted into the highly doped impurity region 25 have the same conductivity type as the body region 13. For example, when the body region 13 is P-type, the highly doped impurity ions implanted into the highly doped impurity region 25 are P-type. Alternatively, when the body region 13 is N-type, the highly doped impurity ions implanted into the highly doped impurity region 25 are N-type. The lightly doped impurity regions 20 remain at respective sides of the gate electrode 15, below the insulating spacers 21. The photoresist pattern 23 and the anti-reflective coating layer are removed after the ion implantation.

Figure 7:
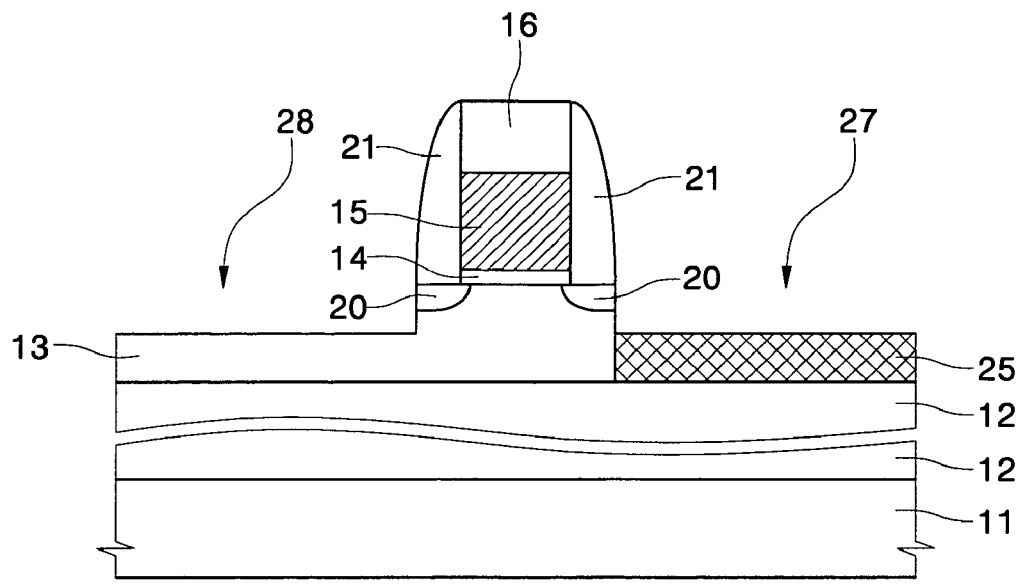

Referring to FIG. 7, the body region 13 and the highly doped impurity region 25 are partially etched using the insulating spacers 21 and the hard mask pattern 16 as etch masks to form a source trench 27 and a drain trench 28 at respective sides of the gate electrode 15. When the trenches 27 and 28 are formed, bottom surfaces of the trenches 27 and 28 may be etched to be deeper than the lightly doped impurity regions 20, portions of which remain below the insulating spacers 21. The thickness of the highly doped impurity region 25 is decreased by formation of the source trench 27, that is, a top surface of the highly doped impurity region 25 is recessed such that its upper surface is lower than the lightly doped impurity regions 20. The bottom surface of the drain trench 28 is also lower than the lightly doped impurity regions 20.

Referring to FIG. 8, a selective epitaxial growth (SEG) technique is performed on the substrate 11 to form undoped epitaxial layers 31 and 32. The undoped epitaxial layers 31 and 32 have the same crystalline state as the highly doped impurity region 25 and the body region 13, which are exposed at the bottoms of the trenches 27 and 28. For example, if the body region 13 and the highly doped impurity region 25 are single crystalline silicon layers and an SEG technique is performed using a silicon source gas, the undoped epitaxial layers 31 and 32 are single crystalline silicon structures. The undoped epitaxial layers 31 and 32 completely fill the trenches 27 and 28 and top surfaces of the undoped epitaxial layers 31 and 32 are grown higher than the gate insulating layer 14. For example, the top surfaces of the undoped epitaxial layers 31 and 32 may be higher than the gate insulating layer 14 by 10 nm.

Referring to FIG. 9, impurity ions of a second conductivity type are selectively implanted into the undoped epitaxial layers 31 and 32 using the insulating spacer 21 and the hard mask pattern 16 as ion implantation masks, thus forming the source region 31A at one side of the gate electrode 15 and a drain region 32A at the other side of the gate electrode 15. As a result, a body pattern 13A is formed. One sidewall of the body pattern 13A is in contact with the drain region 32A, and the other sidewall of the body pattern 13A is in contact with the source region 31A and the highly doped impurity region 25.

The impurity ions of the second conductivity type have a conductivity type opposite to the first conductivity type. For example, when the body region 13 is formed from a P-type semiconductor layer, the impurity ions of the second conductivity type are N-type. Alternatively, when the body region 13 is formed from an N-type semiconductor layer, the impurity ions of the second conductivity type are P-type.

In detail, the impurity ions of the second conductivity type are implanted into the undoped epitaxial layer 31 at one side of the gate electrode 15 to form the source region 31A. In this case, the impurity ions of the second conductivity type may transit the undoped epitaxial layer 31 in a vertical direction, but are impeded from moving out of the undoped epitaxial layer 31 by the highly doped impurity region 25 of the first conductivity type. As a result, a well-defined source region 31A is formed on the highly doped impurity region 25, and protrudes higher than the gate insulating layer 14 as described with reference to FIG. 8.

The impurity ions of the second conductivity type are implanted into the undoped epitaxial layer 31 at the other side of the gate electrode to form the drain region 32A. The impurity ions of the second conductivity type may transit the undoped epitaxial layer 32 in a vertical direction and into the body region 13. As a result, a bottom surface of the drain region 32A may be in contact with a top surface of the lower insulating layer 12, and a top surface of the drain region 32A may protrude higher than the gate insulating layer 14 as described with reference to FIG. 8.

Referring to FIG. 10, an upper inter-insulating layer 40 is formed on the substrate 11 having the elevated source region 31A and the drain region 32A thereon. The upper inter-insulating layer 40 may be an insulating layer, such as a silicon oxide layer, a silicon oxynitride layer, or a silicon nitride layer formed using a CVD method. The upper inter-insulating layer 40, the drain region 32A, the source region 31A, and the highly doped impurity region 25 are patterned to form a drain contact hole and a source contact hole. The drain contact hole penetrates the upper inter-insulating layer 40 to expose the drain region 32A. The drain contact hole may further penetrate the drain region 32A to expose the lower insulating layer 12. The drain contact hole may also penetrate the lower insulating layer 12 to expose a lower circuit.

The source contact hole penetrates the upper inter-insulating layer 40 and the source region 31A to expose the highly doped impurity region 25. The source contact hole may further penetrate the highly doped impurity region 25 to expose the lower insulating layer 12. In further embodiments, the source contact hole may also penetrate the lower insulating layer 12 to expose a lower circuit or the substrate 11.

A drain contact plug 42 and a source contact plug 41 are respectively formed in the drain contact hole and the source contact hole. The contact plugs 41 and 42 may be formed of a conductive material layer. For example, the contact plugs 41 and 42 may be formed from a metal layer, such as a tungsten layer, with a bottom surface and a sidewall surrounded by a barrier metal layer. The barrier metal layer may include titanium (Ti) and/or titanium nitride (TiN). Alternatively, the contact plugs 41 and 42 may be formed without a barrier metal layer.

The drain contact plug 42 penetrates the upper inter-insulating layer 40 to contact the elevated drain region 32A. The drain contact plug 42 may be buried within the drain region 32A to provide good electrical connection. The drain contact plug 42 may further penetrate the drain region 32A to contact the lower insulating layer 12. In further embodiments, the drain contact plug 42 may also penetrate the lower insulating layer 12 to contact a lower circuit.

The source contact plug 41 penetrates the upper inter-insulating layer 40 and the source region 31A to contact the highly doped impurity region 25. The source contact plug 41 may be buried within the highly doped impurity region 25 to provide good electrical connection. The source contact plug 41 may further penetrate the highly doped impurity region 25 to contact the lower insulating layer 12. In additional embodiments, the source contact plug 41 may also penetrate the lower insulating layer 12 to contact a lower circuit or the substrate 11. The source region 31A, the highly doped impurity region 25, and the body pattern 13A are electrically connected to each other through the source contact plug 41, providing a MOSFET having a BTTS structure.

According to exemplary embodiments of the present invention described above, a highly doped impurity region of a first conductivity type is provided having a sidewall in contact with a body pattern and a thickness less than the body pattern. A source region of a second conductivity type has a sidewall in contact with the body pattern and is disposed on the highly doped impurity region. A contact plug penetrates the source region to contact the highly doped impurity region. Accordingly, the source region, the highly doped impurity region, and the body pattern are electrically connected to each other through the source contact plug, providing a BTTS structure. Consequently, the body of the MOS transistor may be prevented from floating.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A metal oxide semiconductor field effect transistor (MOSFET), comprising:
    a body pattern of a first conductivity type disposed on an insulating layer;
    a gate electrode disposed on the body pattern;
    a drain region of a second conductivity type disposed on the insulating layer and having a sidewall in contact with a first sidewall of the body pattern;
    an impurity-doped region of the first conductivity type disposed on the insulating layer and having a sidewall in contact with a second sidewall of the body pattern;
    a source region of the second conductivity type disposed on the impurity-doped region and having a sidewall in contact with the second sidewall of the body pattern, wherein at least an upper portion of the source region lacks impurities of the first conductivity type present in the impurity-doped region; and
    a contact plug extending through the source region to contact the impurity-doped region.

2. The MOSFET of claim 1, wherein the impurity-doped region is thinner than the body pattern.

3. The MOSFET of claim 1, wherein the body pattern comprises a single crystalline silicon layer, a polycrystalline silicon layer, a germanium layer or a compound semiconductor layer.

4. The MOSFET of claim 1, wherein the second conductivity type is N-type and the first conductivity type is P-type or wherein the second conductivity type is P-type and the first conductivity type is N-type.

5. The MOSFET of claim 1, further comprising a gate insulating layer interposed between the gate electrode and the body pattern.

6. The MOSFET of claim 5, wherein upper surfaces of the source and drain regions are higher than a top surface of the gate insulating layer.

7. The MOSFET of claim 1, further comprising a hard mask pattern disposed on the gate electrode.

8. The MOSFET of claim 1, further comprising an insulating spacer disposed on a sidewall of the gate electrode.

9. The MOSFET of claim 8, further comprising a lightly doped source region adjacent the source region and underlying the insulating spacer.

10. The MOSFET of claim 1, wherein the contact plug extends throughthe source region and the impurity-doped region.

11. The MOSFET of claim 1, wherein the contact plug extends throughthe source region, the impurity-doped region, and the first insulating layer.

* * * * *

UNITED STATES PATENT AND TRADEMARK OFFICE
CERTIFICATE OF CORRECTION

| | |
|---|---|
| PATENT NO. | : 7,432,560 B2 |
| APPLICATION NO. | : 11/179236 |
| DATED | : October 7, 2008 |
| INVENTOR(S) | : Lim et al. |

Page 1 of 1

It is certified that error appears in the above-identified patent and that said Letters Patent is hereby corrected as shown below:

<u>In the Claims:</u>

Column 12, Claim 10, Line 48: Please correct "throughthe"
                                          To read -- through the --

Column 12, Claim 11, Line 51: Please correct "throughthe"
                                          To read -- through the --

Signed and Sealed this

Second Day of December, 2008

JON W. DUDAS
*Director of the United States Patent and Trademark Office*